United States Patent
Kato (10) Patent No.: US 7,443,515 B2
(45) Date of Patent: Oct. 28, 2008

(54) APPARATUS FOR MEASURING OPTICAL PROPERTIES OF TESTED OPTICAL SYSTEM USING INTERFERENCE

(75) Inventor: Seima Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 306 days.

(21) Appl. No.: 11/204,439

(22) Filed: Aug. 15, 2005

(65) Prior Publication Data
US 2006/0044569 A1    Mar. 2, 2006

(30) Foreign Application Priority Data
Sep. 2, 2004    (JP)    ............... 2004-255780

(51) Int. Cl.
G01B 11/02    (2006.01)
(52) U.S. Cl. ..................................... 356/515
(58) Field of Classification Search ................. 356/515, 356/521
See application file for complete search history.

(56) References Cited

U.S. PATENT DOCUMENTS

| 5,835,217 | A |   | 11/1998 | Medecki |  |
|---|---|---|---|---|---|
| 6,122,056 | A | * | 9/2000 | Hibbs et al. | ........... 356/450 |
| 6,312,373 | B1 |   | 11/2001 | Ichihara |  |
| 6,456,382 | B2 |   | 9/2002 | Ichihara |  |
| 6,765,683 | B2 | * | 7/2004 | Ichihara | ........... 356/521 |
| 7,283,252 | B2 | * | 10/2007 | Kato | ........... 356/515 |
| 7,295,327 | B2 | * | 11/2007 | Ohkubo | ........... 356/515 |
| 7,403,291 | B2 | * | 7/2008 | Yamamoto et al. | ........... 356/515 |
| 2001/0028462 | A1 | * | 10/2001 | Ichihara et al. | ........... 356/512 |
| 2002/0191195 | A1 | * | 12/2002 | Ichihara et al. | ........... 356/521 |
| 2003/0215053 | A1 | * | 11/2003 | Ichihara | ........... 378/36 |
| 2004/0174533 | A1 | * | 9/2004 | Nakauchi | ........... 356/515 |
| 2005/0117171 | A1 | * | 6/2005 | Kato | ........... 356/521 |
| 2005/0190378 | A1 | * | 9/2005 | Nakauchi | ........... 356/515 |
| 2005/0237540 | A1 | * | 10/2005 | Ohkubo | ........... 356/515 |
| 2006/0044536 | A1 | * | 3/2006 | Ohsaki | ........... 355/52 |
| 2006/0119821 | A1 | * | 6/2006 | Ando et al. | ........... 355/55 |
| 2006/0262323 | A1 | * | 11/2006 | Yamamoto | ........... 356/515 |
| 2007/0153294 | A1 | * | 7/2007 | Tezuka | ........... 356/515 |
| 2007/0229848 | A1 | * | 10/2007 | Yamamoto | ........... 356/515 |
| 2007/0285671 | A1 | * | 12/2007 | Tezuka | ........... 356/515 |

FOREIGN PATENT DOCUMENTS

JP    57-064139 A    4/1982
JP    2000-097666 A    4/2000

OTHER PUBLICATIONS

Optical Shop Testing, ed. Daniel Malacara, John Wiley & Sons, Inc., 231 (1978), pp. 112-113.
Optical Shop Testing, ed. Daniel Malacara, John Wiley & Sons, Inc., 231 (1978).

* cited by examiner

Primary Examiner—Tarifur Chowdhury
Assistant Examiner—Jonathon D Cook
(74) Attorney, Agent, or Firm—Canon USA Inc IP Division (57) ABSTRACT

A measuring apparatus for measuring the optical properties of an optical system including a mask with a slit and a window, upon which different light beams are focused to derive an interference pattern. The interference pattern can be used to obtain optical properties of the optical system.

7 Claims, 9 Drawing Sheets

APPARATUS FOR MEASURING OPTICAL PROPERTIES OF TESTED OPTICAL SYSTEM USING INTERFERENCE

BACKGROUND OF THE INVENTION

1. Field of the Invention

The present invention generally relates to an apparatus for measuring the optical properties of an optical system, and more particularly, though not exclusively, to an apparatus for measuring the wavefront aberration of a projection optical system of a projection exposure apparatus.

2. Description of the Related Art

A reduction projection type exposure apparatus for transferring a pattern formed on a reticle (photomask) to a substrate (a resist-coated wafer) is used in the photolithography process for manufacturing (e.g., semiconductor devices, liquid crystal display devices). Since such an exposure apparatus is required to transfer the pattern on the reticle to the substrate accurately at a predetermined reduction rate, it is important to use a projection optical system with high imaging performance with less aberration. With the recent demand for finer semiconductor devices, the transfer pattern has become more sensitive to the aberration of an optical projection system. Therefore, now there is an increased demand for measuring the optical properties, especially wavefront aberration, of a projection optical system with a high degree of precision. Apparatuses using point diffraction interferometry (hereinbelow called "PDI") have been discussed for measuring the wavefront aberration of a projection optical system with a high degree of precision (for example, see Japanese Patent Application Laid-Open No. 57-064139 (1982), U.S. Pat. No. 5,835,217, Japanese Patent Application Laid-Open No. 2000-097666, and Optical Shop Testing, ed. Daniel Malacara, John Wiley & Sons, Inc., 231 (1978)).

Figure 7:
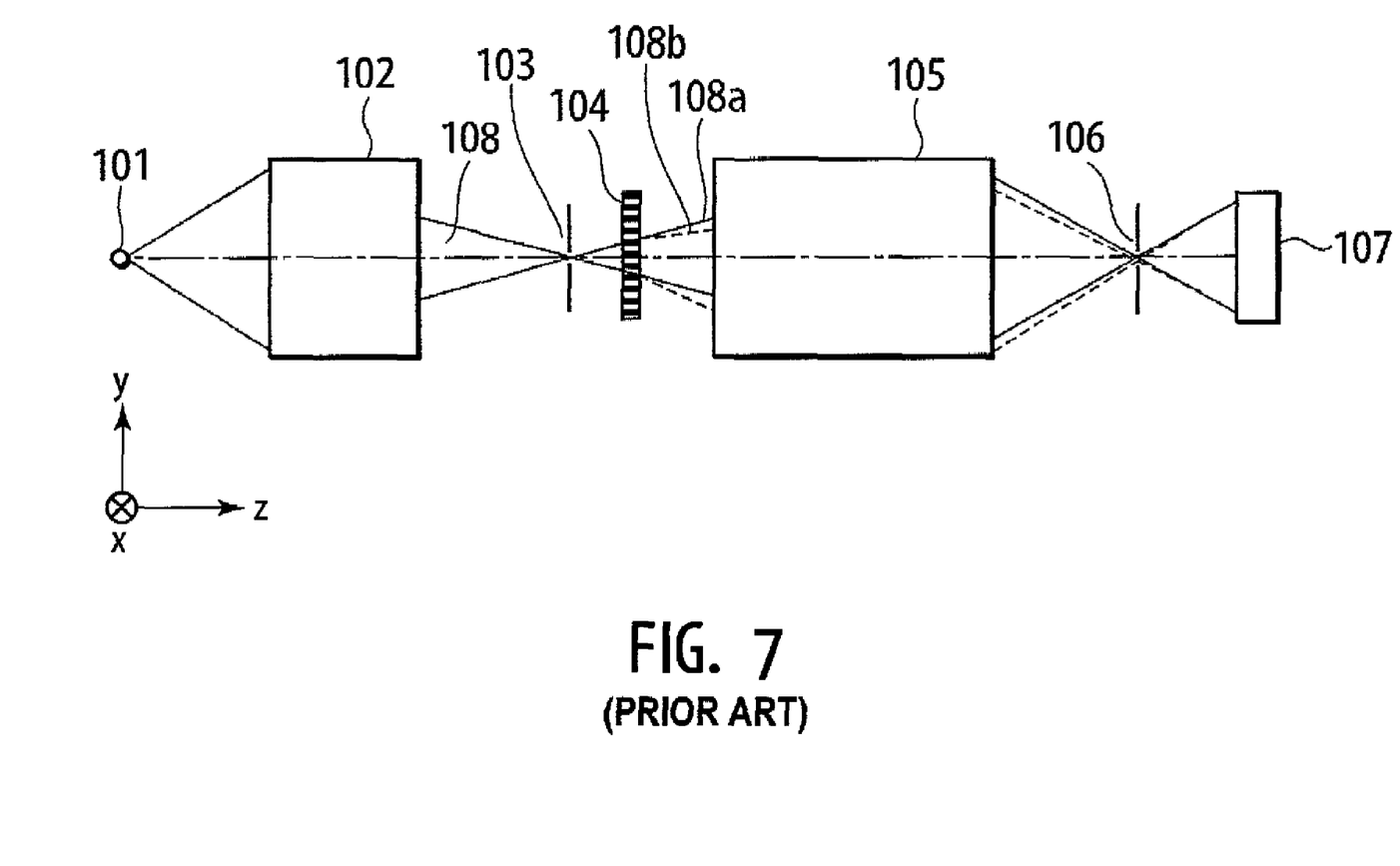
FIG. 7 illustrates a schematic diagram of the conventional PDI.
Figure 9:
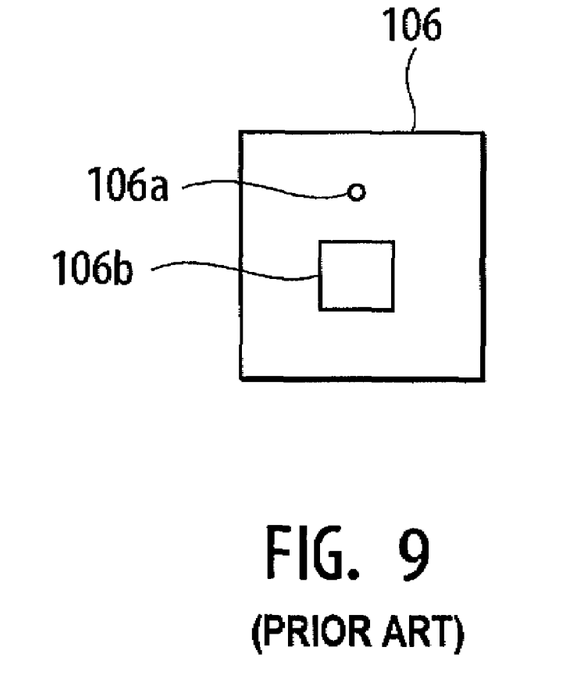
FIG. 9 is an illustration of an image-side mask for the conventional PDI.

Referring to FIGS. 7 and 9, the principles of a PDI will be described below. FIG. 7 illustrates a schematic diagram of a PDI. In FIG. 7, the PDI includes a light source 101, a light-condensing optical system 102 (e.g., an illumination optical system), light-splitting device 104 (e.g., a diffraction grating), a tested optical system 105, and detector 107 (e.g., a CCD).

Figure 8:
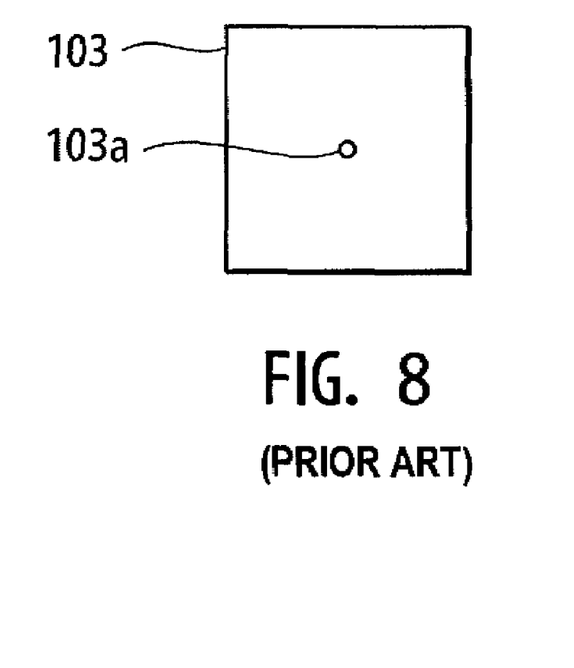
FIG. 8 is an illustration of an object-side mask for the conventional PDI.

An object-side mask 103 can be made of a light-shielding material with a pinhole 103a formed in it as shown in FIG. 8. An image-side mask 106 is made of a light-shielding material with a pinhole 106a and a window 106b arranged as shown in FIG. 9. Tested light that passed through the tested optical system 105 passes through the window 106b.

Light emitted from the light source 101 is condensed through the light-condensing optical system 102 and focused on the pinhole 103a. Since the size of the pinhole 103a is made smaller than the diffraction limit of the incident light, the light that passed through the pinhole 103a acts as if a point source of light were arranged at the position of the pinhole 103a. In other words, the light from the pinhole 103a is an essentially ideal spherical wave, from which aberration information of the light-condensing optical system 102 is reduced, and is headed toward the tested optical system 105. The diffraction grating 104 residing between the object-side mask 103 and the tested optical system 105 is arranged in parallel with x-axis to split the light into beams in up-and-down directions in FIG. 7 so that the beams will be directed at angles according to the pitch of the diffraction grating. In FIG. 7, the zeroth-order diffracted beam and the first-order diffracted beam are indicated by 108a and 108b, respectively.

Among the beams transmitted through the tested optical system 105, the zeroth-order beam 108a indicated by the solid line is focused on the pinhole 106a, while the first-order beam 108b indicated by the dotted line is focused on the window 106b. Since the pinhole 106a is sufficiently smaller than the diffraction limit of the zeroth-order beam 108a, the zeroth-order diffracted beam 108a becomes an essentially ideal spherical wave originating from the pinhole 106a, from which aberration of the tested optical system 105 is reduced. On the other hand, since the first-order diffracted light 108b passes through the window 106b with an opening much larger than the diffraction limit, it has a wavefront maintaining the aberration information of the tested optical system 105. The two beams overlap after passing through the image-side mask 106 to form interference fringes. The interference fringes are observed by a detector 107.

The interference fringes are formed by the two diffracted beams: one is a reference beam without the aberration information of the tested optical system 105 from the pinhole 106a while the other is a tested beam with the aberration information of the tested optical system 105 from the window 106b. The optical properties (e.g., wavefront aberration) of the tested optical system 105 can be determined from the interference fringes.

The pinhole 103a of the object-side mask 103 and the pinhole 106a of the image-side mask 106 are made sufficiently small, so that the wavefront of the beam emitted from each pinhole is very close to an ideal spherical wave. This makes it possible to determine the wavefront aberration of the tested optical system 105 with a very high degree of precision. In addition, the zeroth-order beam 108a and the first-order beam 108b pass through almost the same light path, and this can achieve high reproducibility.

The PDI can measure the wavefront aberration of a tested optical system in principle. However, detection of a wavefront aberration with a high degree of precision using a conventional PDI can be difficult.

The first issue is that the pinholes used for the PDI are small, thus, the amount of light passing through the pinholes is reduced providing a reduced amount of light, especially in the pinhole of the image-side mask. A reduced amount of light passing through the pinholes can contribute to measurement error. The PDI produces an essentially ideal spherical wave from the pinholes. The diameter of each pinhole that can form the essentially ideal spherical wave is decided from the diffraction limit determined by the wavelength of measured light and NA (Numerical Aperture) of the tested optical system using, for example the relationship $0.61 \times \lambda/NA$. Suppose that EUV (Extreme Ultra Violet) light (e.g., having a wavelength of about 13.5 nm) is used for PDI measurement. In this case, for example, if the NA of the tested optical system is 0.25 and the power is 4×, the diameters of the pinholes should be reduced to about 130 nm in the object-side mask and about 30 nm in the image-side mask, respectively.

Among the two beams passing through the tested optical system, the beam focused on the pinhole 106a of the image-side mask becomes a spherical wave (reference light) after passing through the pinhole, but its light amount is reduced. On the other hand, the beam passing through the window 106b of the image-side mask (tested light) is not subjected to any light amount loss. The difference in light amount between the reference light and the tested light can be increased to reduce the contrast of the interference fringes. The reduction in contrast due to the reduced amount of reference light is not improved even if the intensity of the light source is increased.

The amount of light is also reduced through the object-side pinhole 103a. This means that the amount of light incident on the tested optical system itself becomes reduced. This can become an issue, when the intensity of the light is difficult to increase, for example, like an EUV light source.

The second issue that can arise is that of contamination of the pinholes. For example, when an EUV light source is used as the light source of an interferometer, which has been encased in a near vacuum with residual gas, the EUV light can interact with a hydrocarbon component contained in the residual gas. The interaction of EUV with the hydrocarbon component can result in the deposit of carbon in the pinholes, clogging the pinholes. The clogging of the pinhole can reduce the contrast and hence can make the interference fringes difficult to see clearly. Further, in the process of clogging the pinhole, the shape of the pinhole is deformed so that the reference light may deviate from the shape of a spherical wave. This can be a factor in causing a measurement error in the analysis of the wavefront of the tested optical system.

SUMMARY OF THE INVENTION

At least one exemplary embodiment is directed to an apparatus for measuring, using interference, the optical properties of a tested optical system.

In at least one exemplary embodiment, an apparatus for measuring the optical properties of a tested optical system using interference includes: a first mask illuminated with light from a light source to produce a spherical wave; a light-splitting device for splitting light from the first mask; a second mask provided with a slit and a window in positions on which two light beams split by the light-splitting device are focused respectively; and a detector for detecting interference fringes formed by the light beam passing through the slit and the light beam passing through the window.

Further features of the present invention will be apparent from the following description of exemplary embodiments taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate exemplary embodiments.

DESCRIPTION OF THE EMBODIMENTS

The following description of exemplary embodiment(s) is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate. For example first and second masks are discussed and any material that can be used to form masks should fall within the scope of exemplary embodiments (e.g., glass, Si), as well as methods of forming such masks (e.g., electron beam writing).

Additionally the actual size of the elements (e.g., light splitting device) may not be discussed however any size from macro to nano are intended to lie within the scope of exemplary embodiments (e.g., light splitters with diameters of nanometer size, micro size, centimeter size, and meter sizes). Additionally, the materials and type of light splitting devices may not be discussed however such materials (e.g., materials used for diffraction gratings, prisms, beam splitters) and configurations (e.g., prisms, diffraction gratings, non-linear refractive material, other light splitting devices as known by one of ordinary skill in the relevant art, and equivalents) are intended to lie within the scope of exemplary embodiments.

Additionally exemplary embodiments are not limited to UV light systems, for example the system can be designed for use with infrared and other wavelength systems.

Notice that similar reference numerals and letters refer to similar items in the following figures, and thus once an item is defined in one figure, it may not be discussed for following figures.

Exemplary embodiment(s) will now be described in detail in accordance with the accompanying drawings.

Figure 1:
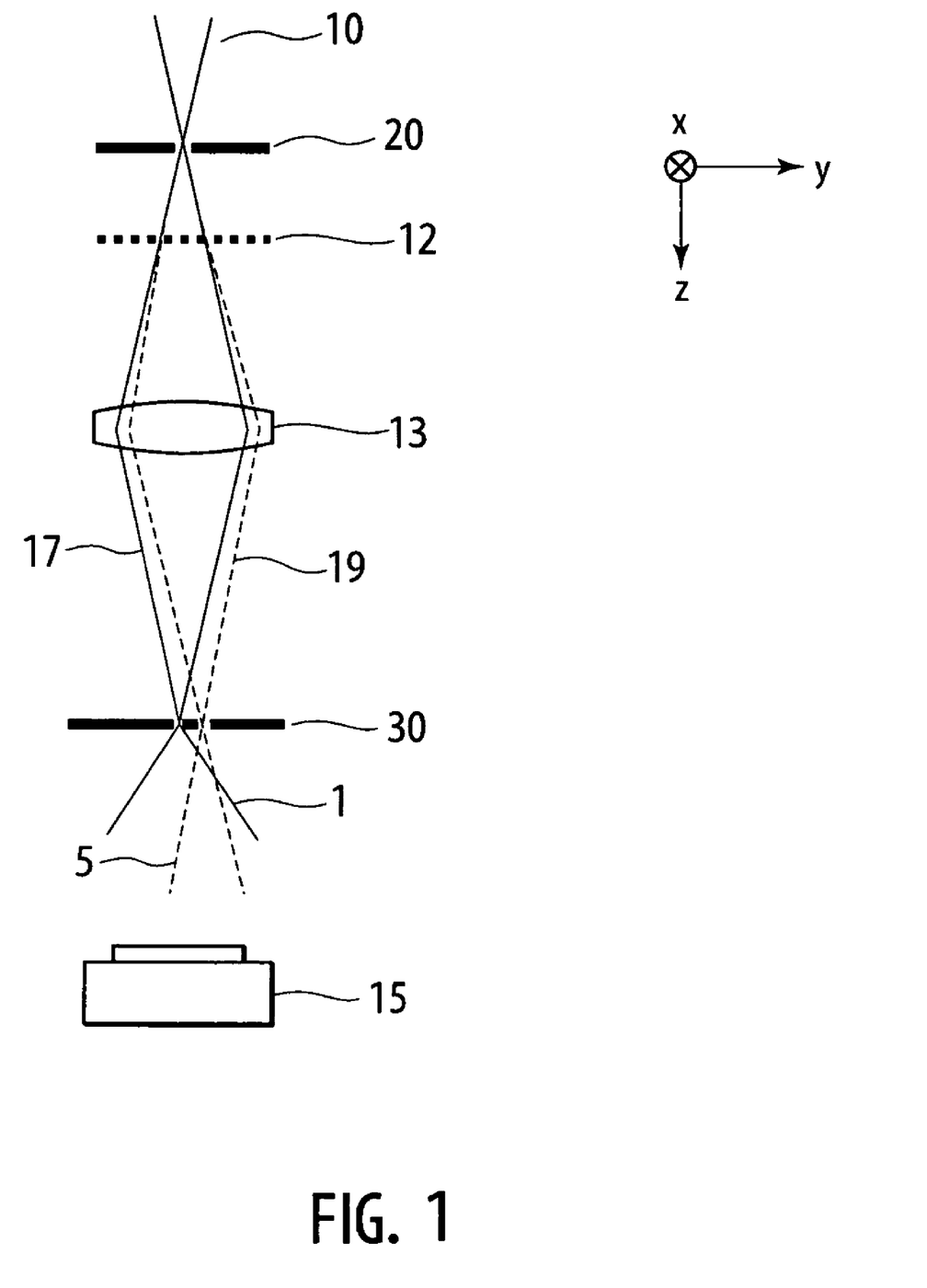
FIG. 1 illustrates a schematic diagram of a measuring apparatus according to an exemplary embodiment.
Figure 2:
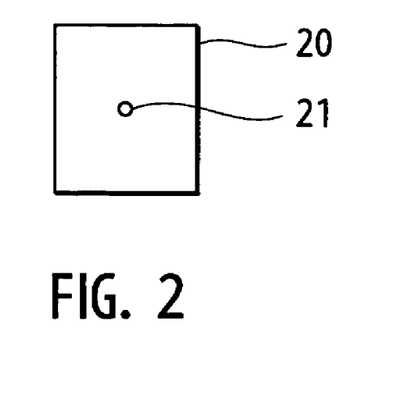
FIG. 2 is an illustration of an object-side mask.
Figure 3A:
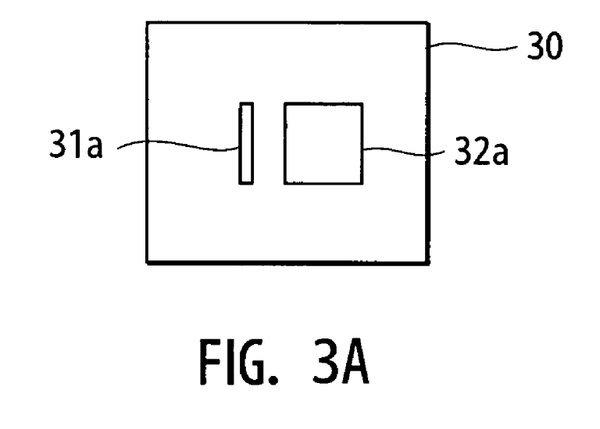
FIGS. 3A and 3B are illustrations of image-side masks.
Figure 3B:
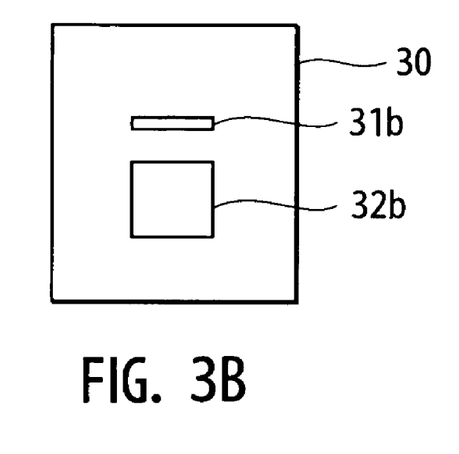

A measuring apparatus of an exemplary embodiment will first be described using FIG. 1. FIG. 1 illustrates a schematic diagram of a measuring apparatus of at least one exemplary embodiment. Shown in FIG. 1 is illumination light 10 from a light source, not shown, an object-side mask (first mask) 20, a light splitting device 12 (e.g., diffraction grating), a tested optical system 13, an image-side mask (the second mask) 30, and a detector 15 (e.g., a CCD). Note that the term "tested optical system" is not meant to infer that exemplary embodiments include only "tested" optical systems. Exemplary embodiments can include untested optical systems and optical systems to be tested. Light emitted from the light source turns into the illumination light 10 illuminating the mask 20 through an illumination optical system, not shown. As shown in FIG. 2, the object-side mask 20 is such that a pinhole 21 is arranged on the x-y plane in FIG. 1. The diameter D of the pinhole can be set equal to or smaller than $D=0.61\times(\lambda/NA_o)$, where $NA_o$ is the object-side numerical aperture of the tested optical system and $\lambda$ is the wavelength of the illumination light. In other words, in exemplary embodiment where the diameter is set equal to or less than the diffraction limit, the aberration of the illumination light can be reduced to produce an essentially ideal spherical wave. The essentially ideal spherical wave produced through the pinhole of the mask 20 is split by the light splitting device 12. The light splitting device 12 can produce several orders of diffracted beams of separated light. The diffracted beam of each order passes through the tested optical system 13, and is focused on the image-side mask 30. As viewed from the x-y plane, the image-side mask 30 has a slit-and-window arrangement as shown in FIGS. 3A and 3B. In other words, a slit (e.g., 31*a* and 31*b*) and a window (e.g., 32*a* and 32*b*) are formed in the image-side mask 30 made of a light-shielding material. FIGS. 3A and 3B show such mask positions that are displaced and angle (e.g., 90 degrees) with respect to each other on the x-y plane.

In at least one exemplary embodiment, after interference fringes are observed using the image-side mask in 3A, the mask is replaced with the mask shown in FIG. 3B (or the mask in FIG. 3A is rotated) to observe interference fringes again, thereby measuring the optical properties (e.g., wavefront aberration value, Zernike coefficient, other optical properties as known by one of ordinary skill in the relevant arts, and equivalents) of the tested optical system 13 from the two patterns of interference fringes obtained, one from the configuration of FIG. 3A and the other from the configuration of FIG. 3B.

The use of the mask in FIG. 3A will first be described. In the case following non-limiting example, the zeroth-order beam, from the light splitting device 12, is focused on the slit 31*a* of the mask 30, while the first-order beam is focused on the window 32*a* of the mask 30. The width w of the slit 31*a* can be set equal to or less than $w=0.5\times(\lambda/NAi)$, where NAi is the image-side numerical aperture of the tested optical system and $\lambda$ is the wavelength of the light source. This arrangement facilitates turning, the light passing through the slit, into an essentially ideal spherical wave in one dimension alone as viewed from the cross section (y-z plane) in the widthwise direction of the slit. In this case, the zeroth-order beam 17 passing through the slit 31*a* becomes reference light 1 from which the aberration of the tested optical system 13 in the y-direction is reduced.

On the other hand, the first-order beam 19, from the light splitting device 12, passing through the window 32 includes aberration information in the light passing through the tested optical system 13. After passing through the image-side mask 30, the reference light 1 and the tested light 5 interfere with each other to create interference fringes on the surface of the detector 15. It can be considered that the reference light 1 has an essentially ideal spherical wave component in one dimension, that is, in the widthwise direction (y-direction) of the slit. However, since the length of the slit in the longitudinal direction (x-direction) of the slit exceeds the diffraction limit, the aberration of the incident light is not reduced. In other words, it can be said that the interference fringes obtained contain accurate wavefront information of the tested optical system in the widthwise direction of the slit. On the contrary, it cannot be said that the interference fringes contain accurate wavefront information in the longitudinal direction of the slit.

For this reason, in at least one exemplary embodiment, the light splitting device 12 can be rotated 90 degrees, and the image-side mask 30 can be replaced with the mask shown in FIG. 3B, which is displaced an angle (e.g., 90 degrees) with respect to the mask in FIG. 3A, to observe interference fringes again. The observation method is the same as described above using the mask in the configuration illustrated in FIG. 3A. The interference fringes observed using the mask in FIG. 3B contain more accurate wavefront information of the tested optical system in the x direction.

From the two patterns of interference fringes thus obtained, wavefronts are calculated, respectively, as components having increased accurate wavefront information. Then, these wavefront components are combined to determine the two-dimensional wavefront (wavefront aberration) of the tested optical system 13.

Figure 5A:
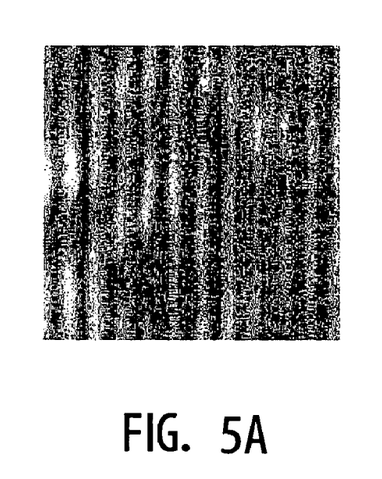
FIG. 5A is a photographic image of interference fringes acquired from the measuring apparatus according to an exemplary embodiment.
Figure 5B:
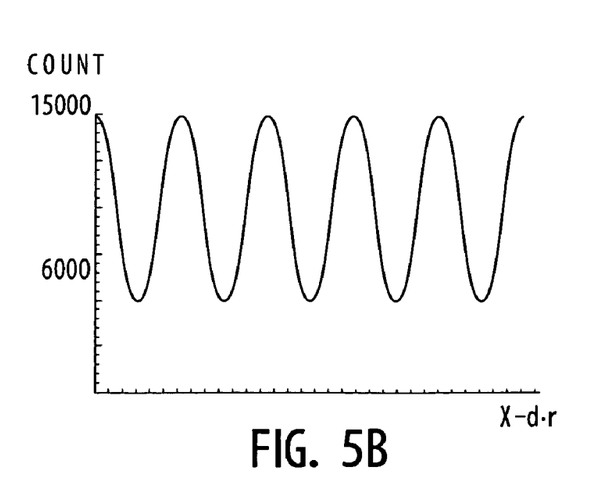
FIG. 5B illustrates a graph of a light intensity distribution acquired from the measuring apparatus according to an exemplary embodiment.

FIG. 5A shows interference fringes observed in the measuring apparatus of at least one exemplary embodiment. The following lists a non-limiting illustrative example of various values in accordance with at least one exemplary embodiment to obtain an interference fringe pattern:

Light source: Radiation light with wavelength of 13.5 nm
Illumination optical system: NA 0.01
Object-side mask: Ta mask of 500 nm thick
Object-side mask pattern: Pinhole of 650 nm f
Diffraction grating: With 7.5-μm grid pitch and 0.24 duty
Tested optical system: Schwarzschild optical system with 0.2 NA
Image-side mask: Ni mask of 150 nm thick
Image-side mask pattern: Slit of 40 nm wide
Detector: Back-thinned and cooled CCD FIG. 5B illustrates a light amount distribution in the cross section of the interference fringe patterns shown in FIG. 5A. The ordinate indicates the amount (intensity) of light received at the detector. The contrast of interference fringes is approximately 0.40. Note that, if the maximum and minimum values of the amount of light received at the detector is max and min, the contrast V is determined as $V=(max-min)/(max+min)$.

Figure 6A:
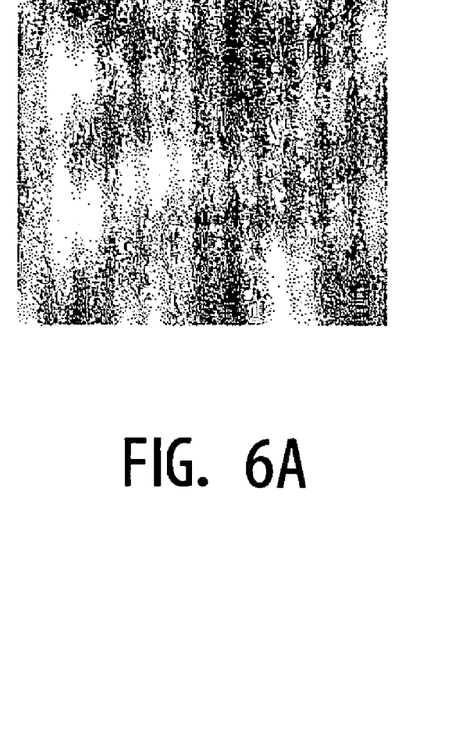
FIG. 6A is a photographic image of interference fringes acquired from a conventional PDI.
Figure 6B:
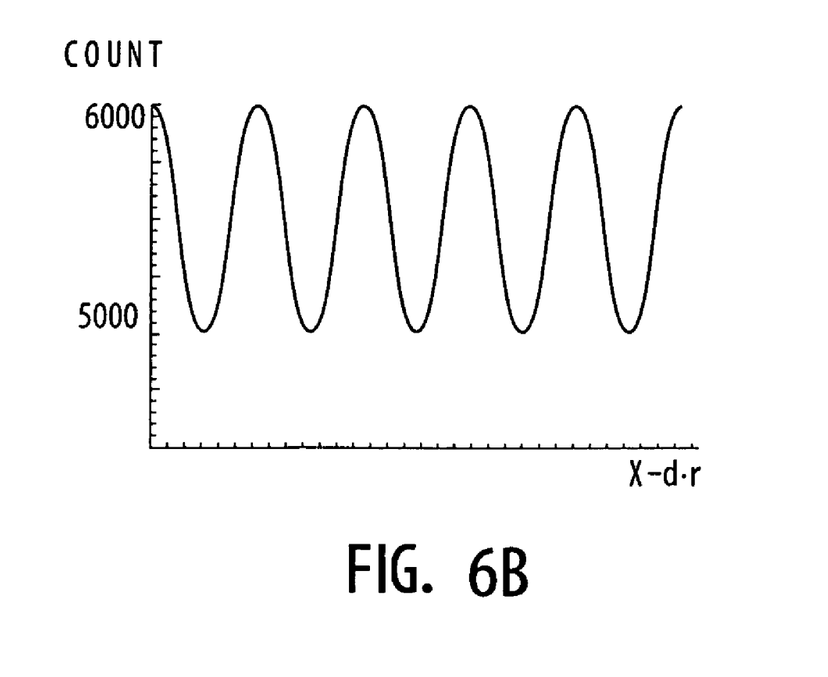
FIG. 6B illustrates a graph of the cross section of a light intensity distribution acquired from the conventional PDI.

FIG. 6A shows interference fringes obtained using the conventional PDI as a comparative example. The experimental conditions to obtain this interference fringe pattern are the same as the above-mentioned illustrative example except that the image-side mask has a pinhole of 40 nm. FIG. 6B illustrates a light amount distribution of the cross section of the interference fringe patterns shown in FIG. 6A. The contrast is approximately 0.13.

From this illustrative example, the system of at least one exemplary embodiment can obtain higher contrast interference fringe pattern than the conventional PDI. Thus, the system according to at least one exemplary embodiment can perform wavefront measurement with higher precision (i.e., higher contrast) than the conventional PDI.

Figure 4:
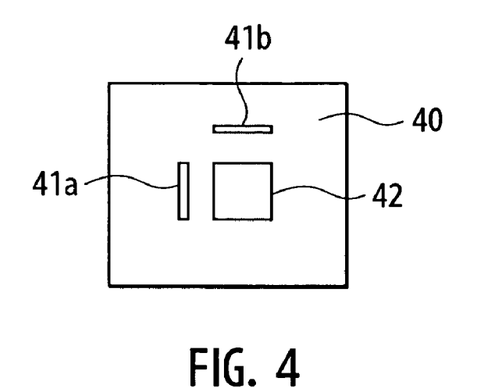
FIG. 4 is an illustration of an image-side mask with two slits.

Although in the illustrative example of at least one exemplary embodiment, measurements are made by switching over between the two image-side masks of FIGS. 3A and 3B, a single mask 40 having slits 41*a* and 41*b* and a window 42 as shown in FIG. 4 may be used instead of using the two masks. Note that although slits 31*a* and 31*b* (and 41*a* and 41*b*) are illustrated as being orientated essentially orthogonal to each other, the slits may be arranged at an angle with respect to each other (e.g., 10 degrees, 45 degrees, 90 degrees).

Since the amount of reference light passing through the slit is higher than the amount of reference light passing through a conventional pinhole, the system in accordance with an exemplary embodiment can have the ratio of the reference light to the tested light higher than that of a conventional PDI. Thus, the detection of high-contrast interference fringes is facilitated. In addition, since the slit is larger in area than the pinhole, the slit is less prone to clogging with residual gas deposits.

Further, in a further exemplary embodiment, where an increase in the total amount of interference fringe light detected by the detector is facilitated, the pinhole of the object-side mask 20 is changed to a slit like the slit of the image-side mask (in this case, the slit of the object-side mask is arranged in the direction corresponding to that of the image-side mask). This can be effective in such cases where it is difficult to increase the power of the light source.

When a slit is arranged in the object-side mask 20 instead of the pinhole, the total amount of interference fringe light can be increased. In this case, however, since the relative light amount ratio between the reference light and the tested light does not change, the contrast of the interference fringes is not increased. On the contrary, a slit in the object-side mask 20 can result in less reduction of the aberration and light amount distribution of illumination light, compared to a pinhole. Therefore, if the total amount of interference fringe light is high enough for measurement, arrangement of the pinhole in the object-side mask can facilitate reduction of aberration. In this non-limiting case, the pinhole facilitates removing the influence of the aberration and light amount distribution of illumination light, i.e., aiding in higher precision measurement.

Since the measuring apparatus of at least one exemplary embodiment uses a line slit instead of a pinhole, a method in accordance with an exemplary embodiment may be called LDI (Line Diffraction Interferometry) with respect to PDI.

The following describes an exemplary embodiment of a projection exposure apparatus equipped with a measuring apparatus in accordance with at least one exemplary embodiment. The measuring apparatus of the above-mentioned embodiment can be equipped in a projection exposure apparatus for exposing a pattern image of a reticle (photomask) onto a photosensitive layer on a wafer (substrate) through a projection optical system, so that the optical properties of the projection optical system can be measured in the exposure apparatus main body with high degree of precision.

Figure 10:
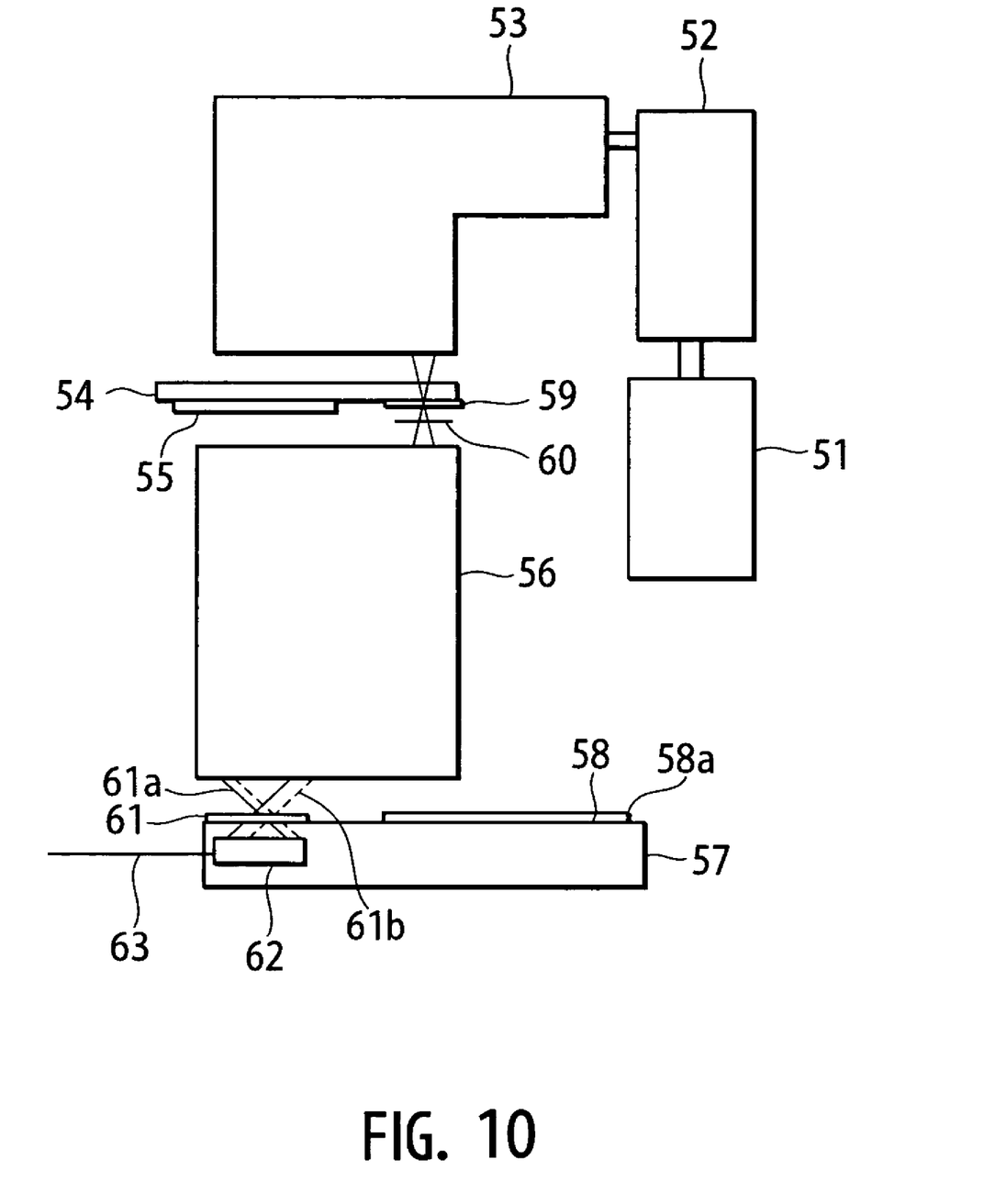
FIG. 10 illustrates a schematic diagram of an exposure apparatus equipped with the measuring apparatus according to an exemplary embodiment.

FIG. 10 illustrates a schematic diagram of the projection exposure apparatus according to an exemplary embodiment. Shown in FIG. 10 are an exposure light source 51 (e.g., an excimer laser), a beam delivery unit 52, and an illumination optical system 53. Also shown in FIG. 10 are a reticle stage 54, a reticle 55, a projection optical system 56, a wafer stage 57, and a wafer 58 with a photosensitive layer deposited thereon 58a. Upon exposure, the exposure light projected from the exposure light source 51 illuminates the reticle 55 on the reticle stage 54 through the beam delivery unit 52 and the illumination optical system 53. A pattern (e.g., a circuit pattern) on the reticle illuminated by the exposure light forms an image on the photosensitive layer 58a, which is deposited on the wafer 58 surface placed on the wafer stage 57, thus exposing the reticle pattern onto the photosensitive layer 58a.

The following describes how the measuring apparatus measures the optical properties (e.g., wavefront aberration value, and Zernike coefficient) of the projection optical system 56. In at least one exemplary embodiment, the exposure light and the illumination optical system 53 for exposure are also used as the light source and the illumination optical system for measuring optical interference, respectively. An object-side mask 59 with a pinhole is held under the reticle stage 54. A light-splitting device 60 (e.g., a diffraction grating) is retained at a predetermined position by a support member, not shown. An image-side mask 61 is held on the wafer stage. A slit and a window are formed in the image-side mask 61. Reference numeral 62 designates a detector (e.g., a CCD).

In operation, light from the exposure light source 51 illuminates the object-side mask 59 so that an essentially ideal spherical wave will be projected from the object-side mask 59. The projected spherical wave is split by the light splitting device 60 in such a manner that the zeroth-order light 61a is focused on the slit of the image-side mask 61 through the projection optical system 56 while the first-order light 61b is focused on the window of the image-side mask 61. These beams of light (61a and 61b) act as reference light and tested light to form interference fringes on the detector 62. Data obtained from the detector 62 are transmitted to a computing unit, not shown, through communication device 63 so that the optical properties of the projection optical system 56 will be calculated on the computing unit based on the interference fringes.

In at least one exemplary embodiment, the measuring apparatus can measure the optical properties of the projection optical system 56 with higher degree of precision than conventional systems using a pinhole. This makes it possible to reduce the aberration of the projection optical system 56, and hence to expose the reticle pattern to the wafer with high degree of precision.

In at least one exemplary embodiment, the exposure light source 51 is also used as the light source used for measuring interference, but any other light source (e.g., a light source for alignment), can be used as the light source used for measuring interference.

Further, in at least one exemplary embodiment, the excimer laser is used as the exposure light source, but the exposure light source is not limited thereto. For example, an exemplary embodiment is applicable to an exposure apparatus using EUV light as its exposure light source. In the case of EUV light (e.g., having a wavelength 5 nm~20 nm), the optical system includes reflective optical elements (e.g., all mirrors), rather than refractive optical elements (e.g., lenses).

The following describes an embodiment of a device manufacturing method using the exposure apparatus equipped with the measuring apparatus in accordance with at least one exemplary embodiment.

Figure 11:
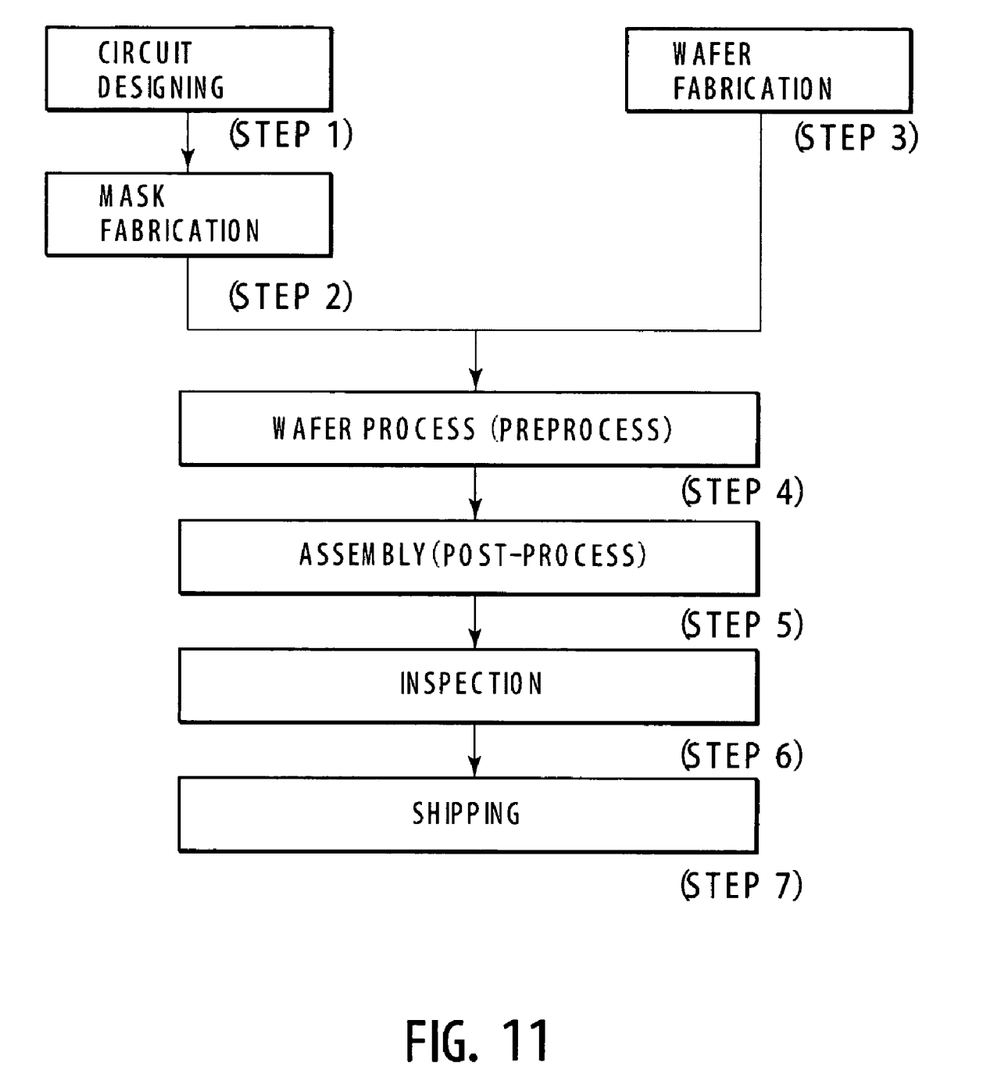
FIG. 11 illustrates a flowchart for explaining device manufacturing in accordance with an exemplary embodiment.

FIG. 11 illustrates a flowchart for explaining how to manufacture semiconductor devices (e.g., semiconductor chips such as IC and LSI chips, liquid crystal panels, CCDs, etc.). In step 1 (circuit designing), a semiconductor device circuit is designed. In step 2 (mask fabrication), a mask on which the designed circuit pattern is formed is made. On the other hand, in step 3 (wafer fabrication), a wafer is fabricated from materials such as silicon and other wafer materials as known by one of ordinary skill in the relevant art and equivalents. In step 4 (wafer process), which is called a preprocess, an actual circuit is formed in a photoresist layer on the wafer by a lithography technique using the mask and wafer prepared as mentioned above. The photoresist layer is subsequently etched to form a pattern of the circuit in the wafer. In the next step 5 (assembly), which is called a post-process, a semiconductor chip is fabricated using the wafer formed in step 4. This step includes an assembly process (dicing and bonding), a packaging process (chip sealing), and other assembling processes as known by one of ordinary skill in the relevant art, and equivalents. In step 6 (inspection), various inspections and tests including operation checking test and durability test are performed on the semiconductor device fabricated at step 5. Through these processes, the semiconductor device is finished and then shipped (step 7).

Figure 12:
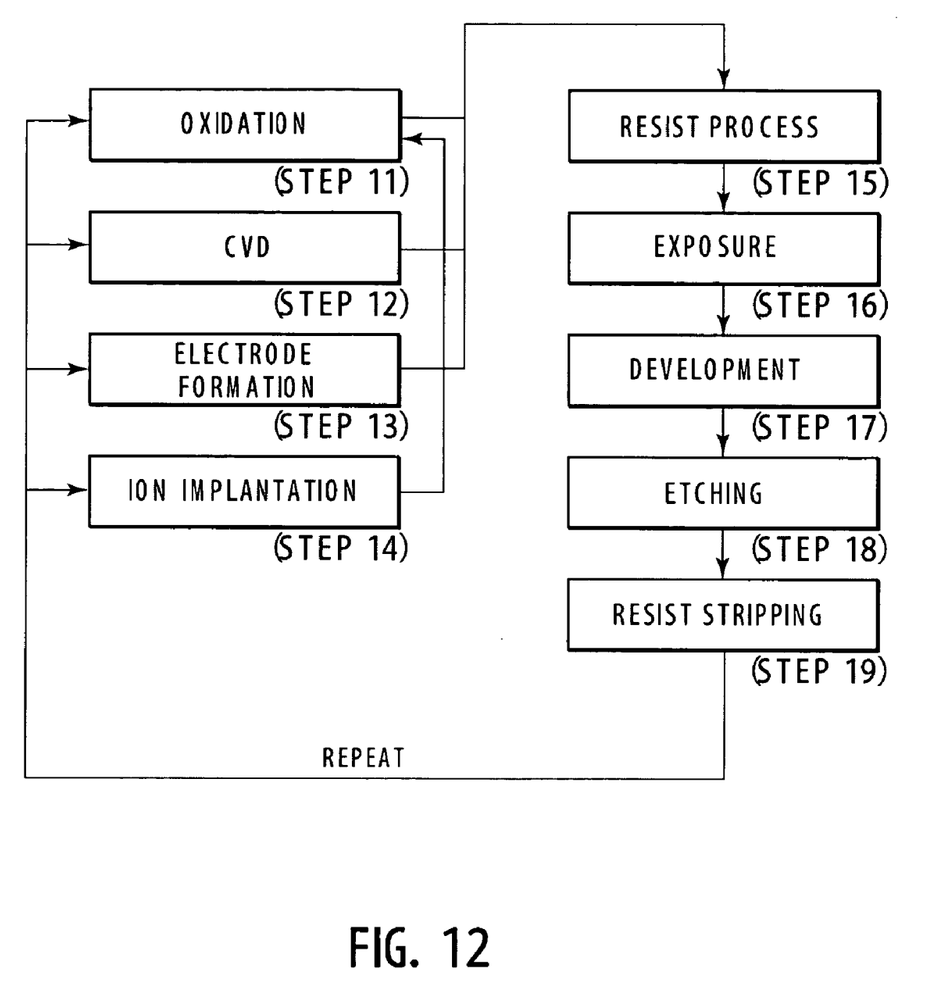
FIG. 12 illustrates a detailed flowchart of wafer process step 4 shown in FIG. 11.

FIG. 12 illustrates a detailed flowchart of the wafer process step 4 in FIG. 11. In step 11 (oxidation), a wafer surface is oxidized. In step 12 (CVD (Chemical Vapor Deposition)), an insulating film is formed on the wafer surface. In step 13 (electrode formation), electrodes are formed on the wafer by vapor deposition or other electrode deposition methods as known by one of ordinary skill in the relevant art, and equivalents. In step 14 (ion implantation), ions are implanted into the wafer. In step 15 (resist process), a photosensitive material is coated onto the wafer. In step 16 (exposure), the mask pattern is exposed onto the photosensitive material deposited on the wafer using the projection exposure apparatus. In step 17 (development), the exposed photosensitive material (developed resist material) is developed. In step 18 (etching), portions other than the developed resist image are etched at a faster rate. In step 19 (resist stripping), unnecessary resist portions are stripped after the etching process. These steps are repeated, and a multiple-layered circuit pattern is formed on the wafer. The use of the manufacturing method of at least one exemplary embodiment facilitates a quick and easy acquisition of the image forming performance of the projection optical system 56. This ensures that the projection optical system 56, of which the wavefront aberration has been reduced with high precision, can be used without reducing exposure throughput. Therefore, high-resolution (highly-integrated) devices (e.g., semiconductor devices, LCD devices, image pickup devices (e.g., CCDs), and thin-film magnetic heads), which have not been fabricated without difficulty, can be manufactured with high productivity and economic efficiency. The projection optical system 56 of which the wavefront aberration has been reduced can align the wafer stage with high precision. Note that the device manufacturing method using such an exposure apparatus and the devices as products (intermediate and final products) also constitute other aspects of at least one exemplary embodiment.

Note that although the formation of spherical waves is stipulated in the claims, the intended meaning is substantially or essentially spherical.

This application claims the benefit of Japanese Patent Application No. 2004-255780 filed on Sep. 2, 2004, which is hereby incorporated by reference herein in its entirety.

As many apparently widely different embodiments of the present invention can be made without departing from the sprit and scope thereof, it is to be understood that the invention is not limited to the specific embodiments thereof.

What is claimed is:

1. An apparatus for measuring the optical properties of an optical system using interference comprising:
   a first mask comprising a pinhole and illuminated with light from a light source to produce a spherical wave from the pinhole;
   a light-splitting device for splitting light from said first mask into a first light beam and a second light beam;
   a second mask provided with a first slit, upon which the first light beam is focused, and a window, upon which the second light beam is focused; and
   a detector for detecting interference fringes formed by the interference of a portion of the first light beam passing through the first slit and a portion of the second light beam passing through the window.

2. The apparatus according to claim 1, wherein if the object-side numerical aperture of the optical system is NAo and the wavelength of light from the light source is $\lambda$, the diameter D of the pinhole meets the following equation:

$$D \leq 0.61 \times (\lambda/NAo).$$

3. The apparatus according to claim 1, wherein said second mask is provided with a second slit, upon which the first light beam is focused wherein the second slit is oriented at an angle with respect to the first slit,
   and wherein the detector detects interference fringes formed by the interference of a portion of the first light beam passing through the second slit and a portion of the second light beam passing through the window.

4. An exposure apparatus comprising:
   a projection optical system for projecting an image pattern of a reticle to a substrate; and
   a measuring apparatus for measuring, using interference, the optical properties of said projection optical system, wherein said measuring apparatus includes
       a first mask comprising a pinhole and illuminated with light from a light source to produce a spherical wave from the pinhole,
       a light-splitting device for splitting light from the first mask into a first light beam and a second light beam,
       a second mask provided with a first slit, upon which the first light beam is focused, and a window, upon which the second light beam is focused, and
   a detector for detecting interference fringes formed by the interference of a portion of the first light beam passing through the first slit and a portion of the second light beam passing through the window.

5. The apparatus according to claim 4, wherein if the object-side numerical aperture of the tested optical system is NAo and the wavelength of light from the light source is $\lambda$, the diameter D of the pinhole meets the following equation:

$$D \leq 0.61 \times (\lambda/NAo).$$

6. The apparatus according to claim 4, wherein the second mask is provided with a second slit, upon which the first light beam is focused wherein the second slit is oriented at an angle with respect to the first slit
   and wherein the detector detects interference fringes formed by the interference of a portion of the first light beam passing through the second slit and a portion of the second light beam passing through the window.

7. A device manufacturing method comprising the steps of:
   exposing a photosensitive layer on a substrate using an exposure apparatus; and
   developing the exposed photosensitive layer, wherein the exposure apparatus includes
       i) a projection optical system for projecting an image pattern of a reticle to the photosensitive layer, and
       ii) a measuring apparatus for measuring, using interference, the optical properties of the projection optical system, wherein the measuring apparatus has
           a) a first mask comprising a inhole and illuminated with light from a light source to produce a spherical wave from the pinhole,
           b) light-splitting device for splitting light from the first mask into a first light beam and a second light beam,
           c) a second mask provided with a slit, upon which the first light beam is focused, and a window, upon which the second light beam is focused, and
           d) a detector for detecting interference fringes formed by the interference of a portion of the first light beam passing through the slit and a portion of the second light beam passing through the window.

* * * * *